United States Patent
Raimar et al.

(10) Patent No.: US 11,990,907 B2
(45) Date of Patent: May 21, 2024

(54) CLOSED LOOP OSCILLATOR

(71) Applicant: Cypress Semiconductor Corporation, San Jose, CA (US)

(72) Inventors: Nandakishore Raimar, Bangalore (IN); Brajveer Singh, Kammnahalli (IN); Iulian Gradinariu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/954,126

(22) Filed: Sep. 27, 2022

(65) Prior Publication Data

US 2024/0106422 A1    Mar. 28, 2024

(51) Int. Cl.
| | |
|---|---|
| *H03K 3/0231* | (2006.01) |
| *H03B 5/04* | (2006.01) |
| *H03B 5/24* | (2006.01) |
| *H03K 3/03* | (2006.01) |
| *H03L 7/099* | (2006.01) |

(52) U.S. Cl.
CPC ............ *H03K 3/0231* (2013.01); *H03B 5/04* (2013.01); *H03B 5/24* (2013.01); *H03K 3/0315* (2013.01); *H03L 7/0992* (2013.01); *H03L 7/0995* (2013.01)

(58) Field of Classification Search
CPC ... H03L 7/0995; H03L 7/0992; H03K 3/0315; H03K 3/0231; H03B 5/24; H03B 5/04
USPC ...................... 331/111, 143, 16, 34
See application file for complete search history.

(56) References Cited

U.S. PATENT DOCUMENTS

| | | | |
|---|---|---|---|
| 8,368,472 B2 * | 2/2013 | Nakamura | G05F 1/561 327/39 |
| 9,503,106 B1 * | 11/2016 | Ding | H03L 7/00 |
| 9,991,897 B1 * | 6/2018 | Park | H03L 7/099 |

* cited by examiner

*Primary Examiner* — Arnold M Kinkead

(57) ABSTRACT

One or more devices, systems, and/or methods are provided. In an example of the techniques presented herein, an oscillator comprises a voltage controlled oscillator configured to generate an output clock based on a drive signal, a frequency to voltage converter having a time constant and configured to generate a feedback voltage having a decay cycle based on the time constant and a frequency based on a frequency of the output clock, and an integrator configured to generate the drive signal based on an integration of the feedback voltage and a reference voltage.

16 Claims, 4 Drawing Sheets

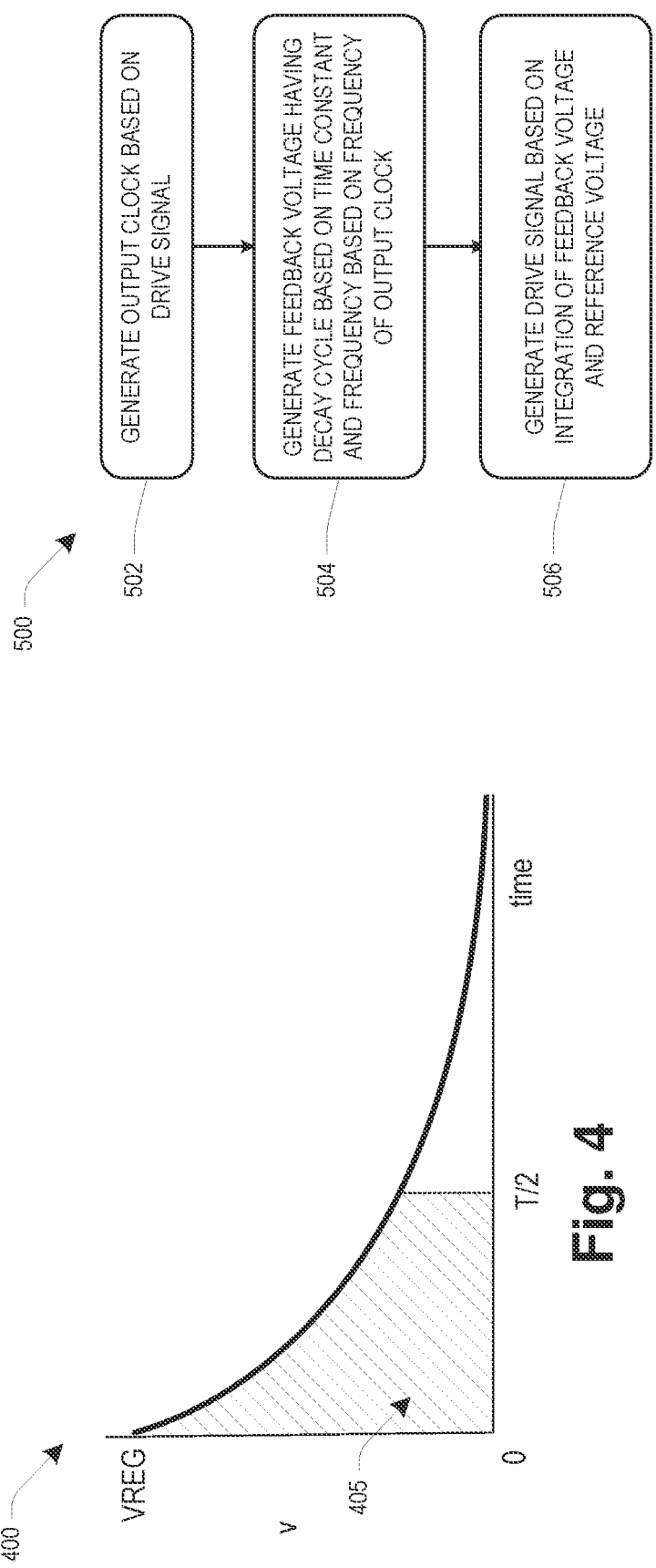

CLOSED LOOP OSCILLATOR

BACKGROUND

Some system architectures employ high speed, high accuracy clock generators. An oscillator that relies on a resistor-capacitor (RC) network to determine the operating frequency is referred to as an RC oscillator. The accuracy of an RC oscillator depends on accurate modeling of the components. Dynamic effects, such as temperature variation, and long term effects from aging tend to change the parameters of the components, thereby reducing accuracy.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment of the techniques presented herein, an oscillator is provided. The oscillator comprises a voltage controlled oscillator configured to generate an output clock based on a drive signal, a frequency to voltage converter having a time constant and configured to generate a feedback voltage having a decay cycle based on the time constant and a frequency based on a frequency of the output clock, and an integrator configured to generate the drive signal based on an integration of the feedback voltage and a reference voltage.

In an embodiment of the techniques presented herein, an apparatus is provided. The apparatus comprises means for generating an output clock based on a drive signal, means for generating a feedback voltage having a decay cycle based on a time constant and a frequency based on a frequency of the output clock, and means for generating the drive signal based on an integration of the feedback voltage and a reference voltage.

In an embodiment of the techniques presented herein, a method is provided. The method comprises generating an output clock based on a drive signal, generating a feedback voltage having a decay cycle based on a time constant and a frequency based on a frequency of the output clock, and generating the drive signal based on an integration of the feedback voltage and a reference voltage.

In an embodiment of the techniques presented herein, an oscillator is provided. The oscillator comprises a voltage controlled oscillator configured to generate an output clock based on a drive signal, a first capacitor connected to a supply voltage, a first resistor connected to the first capacitor at a first node and connected to a reference potential, a first transistor connected to the supply voltage and the first node and having a gate connected to a feedback clock generated based on the output clock, and an integrator connected to the first node and configured to generate the drive signal based on an integration of a feedback voltage at the first node and a reference voltage.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DESCRIPTION OF THE DRAWINGS

FIG. 4 is a diagram illustrating integration of a frequency-to-voltage converter output, in accordance with some embodiments.

FIG. 5 is a flow chart illustrating an example method for generating a clock, in accordance with some embodiments.

DETAILED DESCRIPTION

Figure 1:
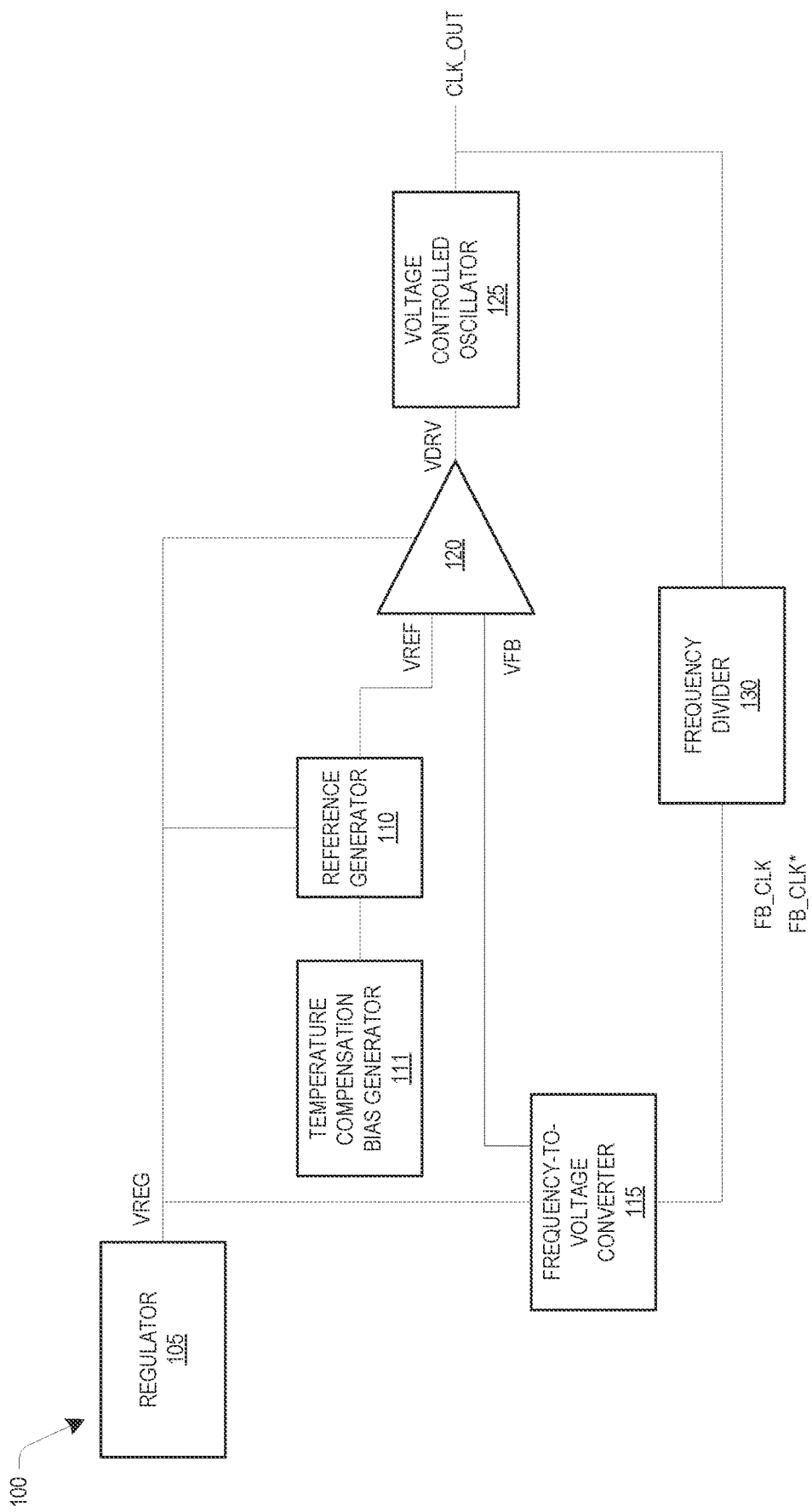
FIG. 1 is a block diagram of an oscillator, in accordance with some embodiments.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

According to some embodiments, an output frequency of a resistor-capacitor (RC) oscillator is controlled using feedback from a frequency-to-voltage converter. A drive signal is generated based on a comparison between the output of the frequency-to-voltage converter and a reference voltage and provided to a frequency controlled oscillator to generate the output frequency using a closed loop technique.

FIG. 1 is a block diagram of an oscillator 100, in accordance with some embodiments. The oscillator 100 comprises an optional regulator 105, a reference generator 110, a temperature compensation bias generator 111, a frequency-to-voltage converter 115, an integrator 120, a voltage controlled oscillator 125, and a frequency divider 130. The regulator 105 generates a regulated supply voltage, VREG, for supplying the reference generator 110, the frequency-to-voltage converter 115, and the integrator 120.

The voltage controlled oscillator 125 generates an output clock, CLK_OUT, having a frequency based on a voltage input from the integrator 120. In some embodiments, the voltage controlled oscillator 125 comprises a ring oscillator. The output clock, CLK_OUT, is provided to the frequency divider 130. The frequency divider 130 generates a feedback clock, FB_CLK, which has a frequency that is equal to the frequency of the output clock, CLK_OUT, divided by an integer, N. In some embodiments, N equals two, so the frequency of the feedback clock, FB_CLK, is half the frequency of the output clock, CLK_OUT. In some embodiments, the frequency divider 130 generates an inverted version of the feedback clock, FB_CLK* that is also provided to the frequency-to-voltage converter 115.

The reference generator 110 generates a reference voltage, VREF. In some embodiments, the reference generator 110 receives a temperature correction input, TEMP_CORR that varies with the temperature of the oscillator 100. In some embodiments, the reference generator 110 receives a correction input from the temperature compensation bias generator 111. The temperature compensation bias generator 111 generates a temperature compensation bias current used by the reference generator 110 to modulate the reference voltage to compensate for the variation of the RC time constant with respect to temperature so that the generated clock frequency remains stable in the presence of temperature variation. In some embodiments, the bias current is proportional to absolute temperature (PTAT) and can be used as compensation to modulate the reference generated by reference generator 110 implemented by a resistive network. The reference voltage may be selected based on $$VREF=k(VREF), \qquad (1)$$

where k is between 0 and 1, and should be proportional to the voltage supply for the frequency to voltage convertor 115 to achieve high frequency stability of the output clock, CLK_OUT.

The frequency-to-voltage converter 115 generates a feedback voltage, VFB, based on the frequency of the feedback clock, FB_CLK. The integrator 120 receives the feedback voltage, VFB, and the reference voltage, VREF, generated by the reference generator 110 to generate a drive signal, VDRV, that serves as the input to the voltage controlled oscillator 125. The integrator 120 varies the drive signal, VDRV, to reduce the error between VREF and VFB. The output of the voltage controlled oscillator 125 varies depending on the VDRV input provided by the integrator 120 to control the output clock, CLK_OUT, thereby providing a closed loop control scheme.

Figure 2:
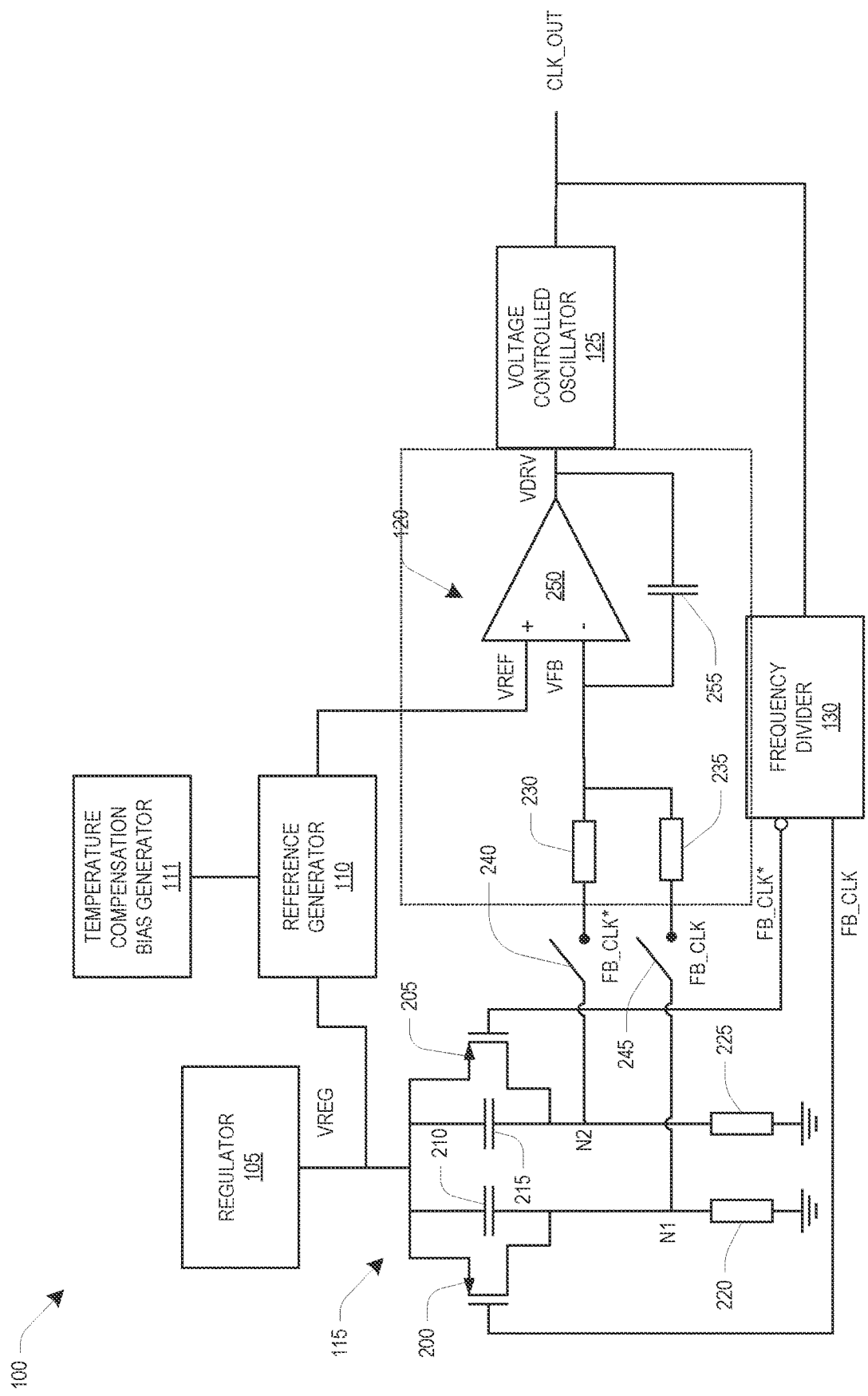
FIG. 2 is a circuit diagram of portions of the oscillator, in accordance with some embodiments.

FIG. 2 is a circuit diagram of the frequency-to-voltage converter 115 and the integrator 120 in the oscillator 100, in accordance with some embodiments. In some embodiments, the frequency-to-voltage converter 115 comprises transistors 200, 205 coupled across capacitors 210, 215. Resistors 220, 225 are coupled to the capacitors 210, 215 at nodes N1, N2, respectively, and are coupled to a reference potential, such as ground. The capacitors 210, 215 have capacitances, C1, C2 and the resistors 220, 225 have resistances, R1, R2. In some embodiments, C1=C2 and R1=R2. Output resistors 230, 235 are selectively coupled to the nodes N1, N2 by switches 240, 245 to generate the feedback voltage, VFB. The switches 240, 245 may be transistors. In some embodiments, the switch 240 is controlled by the FB_CLK, and the switch 245 is controlled by the FB_CLK* signal. A gate of the transistor 200 is connected to the frequency divider 130 to receive the FB_CLK, and a gate of the transistor 205 is connected to the frequency divider 130 to receive the FB_CLK*.

In some embodiments, the integrator 120 comprises an amplifier 250 and a capacitor 255 coupled between the output of the amplifier 250 and the terminal connected to the output resistors to receive the feedback voltage, VFB. The amplifier 250 amplifies a difference between the feedback voltage, VFB and the reference voltage, VREF. The amplifier 250 and the capacitor 255 function to integrate the error between the reference voltage, VREF, and the feedback voltage, VFB.

When the transistor 200 is closed, voltage across the capacitor 210 discharges to zero. When the transistor 200 is open, the capacitor 210 charges exponentially causing the voltage at the bottom plate of the capacitor 210 to move towards ground at the rate defined by the time constant:

$$TC=R1 \times C1. \qquad (2)$$

When the transistor 205 is closed, voltage built up across the capacitor 215 discharges to zero. When the transistor 205 is open, the capacitor 215 charges exponentially causing the voltage at the bottom plate of the capacitor 215 to move towards ground at the rate defined by the time constant:

$$TC=R2 \times C2. \qquad (3)$$

In some embodiments, R1=R2 and C1=02 and the overall time constant for the oscillator 100 is TC (TC=TC1=TC2). The output resistors 230, 235 have a resistance significantly greater than the resistors 220, 225 such that the current flowing through the output resistors 230, 235 is negligible compared to the current flowing through the resistors 220, 225 such that the time constant is not significantly affected by the output resistors 230, 235. For example, the output resistors 230, 235 may have a resistance of at least 500 times the resistance of the resistors 220, 225.

In some embodiments, the transistor 205, the capacitor 215 and the resistor 225 may be omitted from the frequency-to-voltage converter 115 and the feedback voltage, VFB may be generated based on the voltage at the node N1. Employing the transistor 205, the capacitor 215 and the resistor 225 increases the gain of the frequency-to-voltage converter 115.

During a startup period of the oscillator 100, the reference voltage, VREF, ramps up to its predetermined value. The values of VFB and VDRV are initially zero. In response to the increasing value of VREF, the integrator 120 increases the value of VDRV to reduce the error between VREF and VFB. When the turn-on threshold of the voltage controlled oscillator 125 is met, the voltage controlled oscillator 125 starts oscillating and generating the CLK_OUT signal. The frequency divider 130 generates the FB_CLK and FB_CLK* signals, and the frequency-to-voltage converter 115 generates the feedback voltage, VFB that depends on the frequency of the output clock, CLK_OUT (as divided by the frequency divider 130).

The steady state frequency of the output clock, CLK_OUT, depends on the value of TC. The feedback provided by the frequency-to-voltage converter 115 adjusts the output of the voltage controlled oscillator 125 to maintain the accuracy of the output clock, CLK_OUT.

Figure 3:
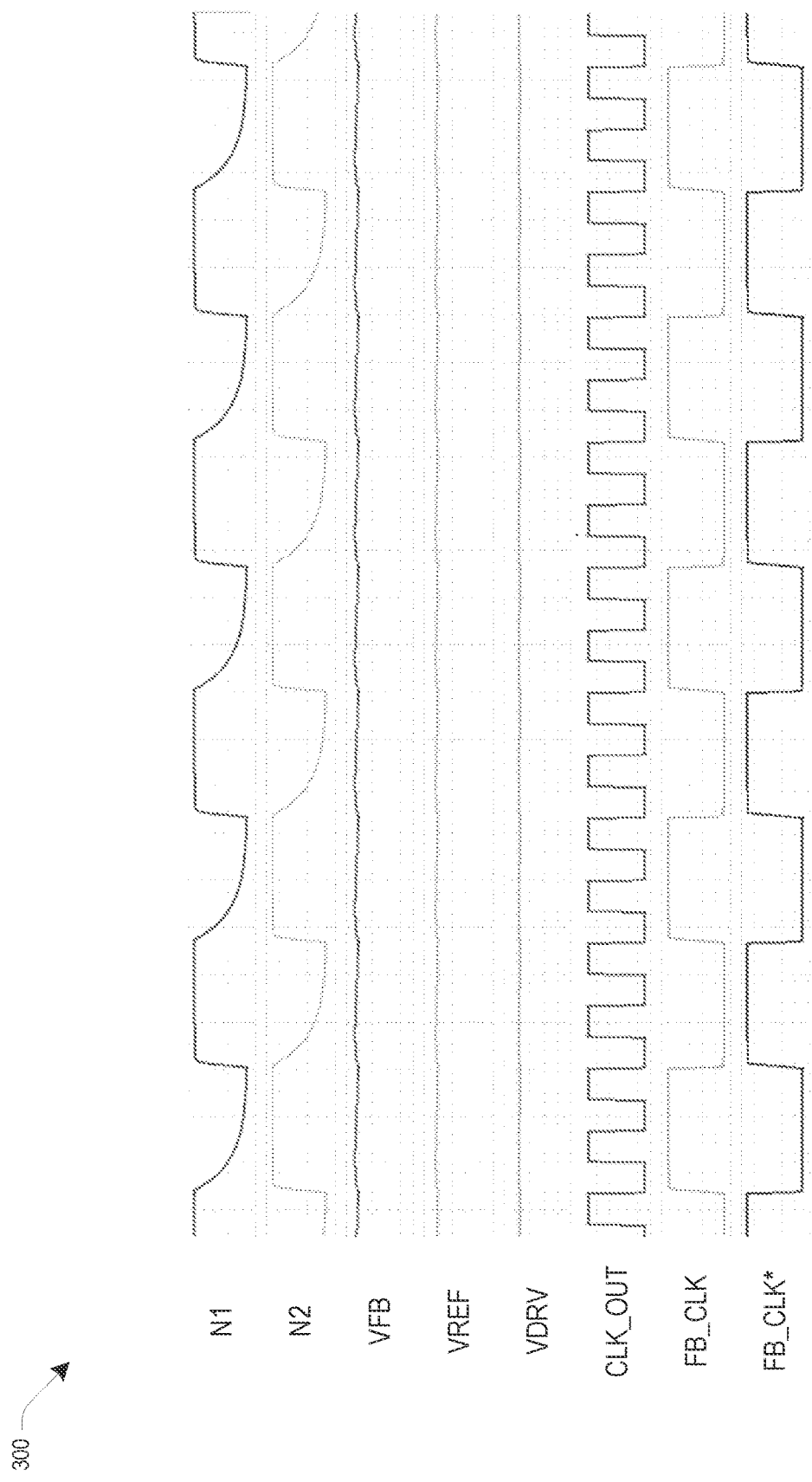
FIG. 3 is a timing diagram illustrating operation of the oscillator, in accordance with some embodiments.

FIG. 3 is a waveform diagram 300 showing waveforms at specified nodes to illustrate operation of the oscillator 100, in accordance with some embodiments. FIG. 3 illustrates the N2, N2, VFB, VREF, VDRV, CLK_OUT, FB_CLK, and FB_CLK* signals at steady state. The signals and nodes N1 and N2 illustrate the charging and decay of the voltages on the capacitors 210, 215 due to the switching of the switches 240, 245 by the FB_CLK and FB_CLK* signals, respectively. The integrator 120 responds to variations in VREF and VFB to generate VDRV for controlling the voltage controlled oscillator 125.

FIG. 4 is a diagram illustrating integration of a frequency-to-voltage converter output, in accordance with some embodiments. FIG. 4 shows a decay cycle 400 for the signal at one of the nodes N1, N2 (VN) when the associated transistor 200, 205 is closed. The DC component of VN, represented by the dashed area 405 under the curve, is:

$$VN_{DC} = \frac{2}{T}\int_0^{T/2} VN(t)dt. \qquad (4)$$

Since the value if VN during the decay cycle 400 starts at the regulated supply voltage, VREG, of the regulator 105 and decays exponentially according to TC, the DC component becomes:

$$VN_{DC} = \frac{2}{T}\int_0^{T/2} VREG \cdot \exp\left(-\frac{t}{RC}\right)dt, \text{ which yields:} \qquad (5)$$

$$VN_{DC} = \frac{2RC}{T}\left(1 - \exp\left(-\frac{T}{2RC}\right)\right). \qquad (6)$$

If X is defined as $$X = \frac{T}{2RC},$$

$$VN_{DC} = \frac{VREG}{X}\left(1 - \frac{1}{e^X}\right), \qquad (7)$$

For steady state:

$$VN_{DC} = VREF = k \cdot VREG, \text{ where } 0 < k < 1. \qquad (8)$$

Combining Equations 4 and 5 yields:

$$\frac{VREG}{X}\left(1 - \frac{1}{e^X}\right) = k \cdot VREG. \qquad (9)$$

After cancelling VREG, $$1 - \frac{1}{e^X} = kX. \qquad (10)$$

For the range of k between 0 and 1, two solutions exist for Equation 7, one of which is the trivial solution where x=0. To derive the non-trivial solution, the frequency is defined as:

$$freq = \frac{1}{T} = \frac{1}{2RCX}. \qquad (11)$$

Assuming a value of 0.632 for k, X≈1, and $$freq = \frac{1}{2RC}. \qquad (12)$$

Considering the divide by N effect of the frequency divider 130, the frequency of the output clock, CLK_OUT, is:

$$freq = \frac{N}{2RC}. \qquad (13)$$

As illustrated in Equation 10, the frequency of the output clock, CLK_OUT, is independent of the supply voltage, VREG for first order effects. The frequency of the output clock, CLK_OUT, is determined by the time constant of the frequency-to-voltage converter 115. As a result, the oscillator 100 is implemented using an RC network with closed loop control, thereby increasing the accuracy of the frequency of the output clock, CLK_OUT. In some embodiments, the oscillator 100 has an accuracy of +/−0.25% or better.

In some embodiments, the oscillator 100 may be used in a computing network that does not include a processor. The oscillator 100 may be used in an application where on-die crystal-less precision clocks are needed. Examples include serial communication protocols, capacitance or other sensing, a high performance MCU, or other suitable applications.

FIG. 5 is a flow chart illustrating an example method 500 for generating a clock, in accordance with some embodiments. At 502, an output clock is generated based on a drive signal. At 504, a feedback voltage having a decay cycle based on a time constant and a frequency based on a frequency of the output clock is generated. At 506, the drive signal is generated based on an integration of the feedback voltage and a reference voltage.

In an embodiment of the techniques presented herein, an oscillator is provided. The oscillator comprises a voltage controlled oscillator configured to generate an output clock based on a drive signal, a frequency to voltage converter having a time constant and configured to generate a feedback voltage having a decay cycle based on the time constant and a frequency based on a frequency of the output clock, and an integrator configured to generate the drive signal based on an integration of the feedback voltage and a reference voltage.

In an embodiment of the techniques presented herein, the integrator comprises an amplifier configured to amplify a difference between the feedback voltage and the reference voltage, and a capacitor coupled between an output of the amplifier and an input of the amplifier configured to receive the feedback voltage.

In an embodiment of the techniques presented herein, the frequency to voltage converter comprises a first capacitor connected to a supply voltage, a first resistor connected to the first capacitor at a first node and connected to a reference potential, and a first transistor connected to the supply voltage and the first node, wherein the integrator is connected to the first node to receive the feedback voltage.

In an embodiment of the techniques presented herein, the oscillator of comprises a frequency divider configured to receive the output clock and generate a feedback clock having a frequency corresponding to a frequency of the output clock divided by an integer, wherein the feedback clock is connected to a gate of the first transistor.

In an embodiment of the techniques presented herein, the frequency to voltage converter comprises a first capacitor connected to a supply voltage, a first resistor connected to the first capacitor at a first node and connected to a reference potential, a first transistor connected to the supply voltage and the first node, a second capacitor connected to the supply voltage, a second resistor connected to the second capacitor at a second node and connected to a reference potential, a second transistor connected to the supply voltage and the first node, a first switch connecting the first node to the integrator, and a second switch connecting the second node to the integrator.

In an embodiment of the techniques presented herein, the oscillator comprises a frequency divider configured to receive the output clock and generate a feedback clock connected to a gate of the first transistor and an inverted feedback clock connected to a gate of the second transistor, wherein the feedback clock and the inverted feedback clock each has a frequency corresponding to a frequency of the output clock divided by an integer.

In an embodiment of the techniques presented herein, the oscillator comprises a regulator configured to generate a supply voltage, and a reference generator configured to generate the reference voltage based on the supply voltage and a temperature compensation bias current, wherein the frequency to voltage converter is connected to the regulator to receive the supply voltage.

In an embodiment of the techniques presented herein, the output clock has a frequency inversely proportional to the time constant of the frequency to voltage converter.

In an embodiment of the techniques presented herein, an apparatus is provided. The apparatus comprises means for generating an output clock based on a drive signal, means for generating a feedback voltage having a decay cycle based on a time constant and a frequency based on a frequency of the output clock, and means for generating the drive signal based on an integration of the feedback voltage and a reference voltage.

In an embodiment of the techniques presented herein, a method is provided. The method comprises generating an output clock based on a drive signal, generating a feedback voltage having a decay cycle based on a time constant and a frequency based on a frequency of the output clock, and generating the drive signal based on an integration of the feedback voltage and a reference voltage.

In an embodiment of the techniques presented herein, generating the drive signal comprises integrating a difference between the reference voltage and the feedback voltage.

In an embodiment of the techniques presented herein, generating the feedback voltage comprises connecting a first capacitor to a supply voltage, connecting a resistor to the first capacitor at a first node and to a reference potential, and controlling a first transistor connected across the supply voltage and the first node to generate the feedback voltage at the first node.

In an embodiment of the techniques presented herein, controlling the transistor comprises dividing the output clock by an integer to generate a feedback clock, and controlling the first transistor based on the feedback clock.

In an embodiment of the techniques presented herein, the method comprises adjusting the reference voltage based on temperature.

In an embodiment of the techniques presented herein, generating the output clock comprises generating the output clock having a frequency inversely proportional to the time constant.

In an embodiment of the techniques presented herein, an oscillator is provided. The oscillator comprises a voltage controlled oscillator configured to generate an output clock based on a drive signal, a first capacitor connected to a supply voltage, a first resistor connected to the first capacitor at a first node and connected to a reference potential, a first transistor connected to the supply voltage and the first node and having a gate connected to a feedback clock generated based on the output clock, and an integrator connected to the first node and configured to generate the drive signal based on an integration of a feedback voltage at the first node and a reference voltage.

In an embodiment of the techniques presented herein, the integrator comprises an amplifier configured to amplify a difference between the feedback voltage and the reference voltage, and a capacitor coupled between an output of the amplifier and an input of the amplifier configured to receive the feedback voltage.

In an embodiment of the techniques presented herein, the oscillator comprises a second capacitor connected to the supply voltage, a second resistor connected to the second capacitor at a second node and connected to a reference potential, a second transistor connected to the supply voltage and the first node and having a gate connected to an inverted version of the feedback clock, a first switch connecting the first node to the integrator, and a second switch connecting the second node to the integrator, wherein the integrator is configured to receive the feedback voltage from one of the first switch or the second switch.

In an embodiment of the techniques presented herein, the oscillator comprises a frequency divider configured to receive the output clock and generate the feedback clock and the inverted version of the feedback clock, wherein the feedback clock and the inverted version of the feedback clock each has a frequency corresponding to a frequency of the output clock divided by an integer.

In an embodiment of the techniques presented herein, the oscillator comprises a reference generator configured to generate the reference voltage based on a temperature compensation bias current.

In an embodiment of the techniques presented herein, the output clock has a frequency inversely proportional to a time constant defined by a resistance of the first resistor and a capacitance of the first capacitor.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. An oscillator, comprising:
a voltage controlled oscillator configured to generate an output clock based on a drive signal;
a frequency to voltage converter having a time constant and configured to generate a feedback voltage having a decay cycle based on the time constant and a frequency based on a frequency of the output clock, wherein the frequency to voltage converter comprises:
a first capacitor connected to a supply voltage,
a first resistor connected to the first capacitor at a first node and connected to a reference potential, and
a first transistor connected to the supply voltage and the first node, wherein:
an integrator is connected to the first node to receive the feedback voltage
the integrator configured to generate the drive signal based on an integration of the feedback voltage and a reference voltage; and
a frequency divider configured to receive the output clock and generate a feedback clock having a frequency corresponding to a frequency of the output clock divided by an integer, wherein the feedback clock is connected to a gate of the first transistor.

2. The oscillator of claim 1, wherein the integrator comprises:
an amplifier configured to amplify a difference between the feedback voltage and the reference voltage; and
a capacitor coupled between an output of the amplifier and an input of the amplifier configured to receive the feedback voltage.

3. The oscillator of claim 1, comprising:
a regulator configured to generate a supply voltage; and
a reference generator configured to generate the reference voltage based on the supply voltage and a temperature compensation bias current, wherein:
the frequency to voltage converter is connected to the regulator to receive the supply voltage.

4. The oscillator of claim 1, wherein:
the output clock has a frequency inversely proportional to the time constant of the frequency to voltage converter.

5. A method, comprising:
generating an output clock based on a drive signal;
generating a feedback voltage having a decay cycle based on a time constant and a frequency based on a frequency of the output clock, wherein generating the feedback voltage comprises:
connecting a first capacitor to a supply voltage,
connecting a resistor to the first capacitor at a first node and to a reference potential, and
controlling a first transistor connected across the supply voltage and the first node to generate the feedback voltage at the first node, wherein controlling the transistor comprises:
dividing the output clock by an integer to generate a feedback clock, and
controlling the first transistor based on the feedback clock; and
generating the drive signal based on an integration of the feedback voltage and a reference voltage.

6. The method of claim 5, wherein generating the drive signal comprises:
integrating a difference between the reference voltage and the feedback voltage.

7. The method of claim 5, comprising:
adjusting the reference voltage based on temperature.

8. The method of claim 5, wherein generating the output clock comprises:
generating the output clock having a frequency inversely proportional to the time constant.

9. An oscillator, comprising:
a voltage controlled oscillator configured to generate an output clock based on a drive signal;
a first capacitor connected to a supply voltage;
a first resistor connected to the first capacitor at a first node and connected to a reference potential;
a first transistor connected to the supply voltage and the first node and having a gate connected to a feedback clock generated based on the output clock; and
an integrator connected to the first node and configured to generate the drive signal based on an integration of a feedback voltage at the first node and a reference voltage.

10. The oscillator of claim 9, wherein the integrator comprises:
an amplifier configured to amplify a difference between the feedback voltage and the reference voltage; and
a capacitor coupled between an output of the amplifier and an input of the amplifier configured to receive the feedback voltage.

11. The oscillator of claim 9, comprising:
a second capacitor connected to the supply voltage;
a second resistor connected to the second capacitor at a second node and connected to a reference potential;
a second transistor connected to the supply voltage and the first node and having a gate connected to an inverted version of the feedback clock;
a first switch connecting the first node to the integrator; and
a second switch connecting the second node to the integrator, wherein:
the integrator is configured to receive the feedback voltage from one of the first switch or the second switch.

12. The oscillator of claim 11, comprising:
a frequency divider configured to receive the output clock and generate the feedback clock and the inverted version of the feedback clock, wherein:
the feedback clock and the inverted version of the feedback clock each has a frequency corresponding to a frequency of the output clock divided by an integer.

13. The oscillator of claim 9, comprising:
a reference generator configured to generate the reference voltage based on a temperature compensation bias current.

14. The oscillator of claim 9, wherein:
the output clock has a frequency inversely proportional to a time constant defined by a resistance of the first resistor and a capacitance of the first capacitor.

15. An oscillator, comprising:
a voltage controlled oscillator configured to generate an output clock based on a drive signal;
a frequency to voltage converter having a time constant and configured to generate a feedback voltage having a decay cycle based on the time constant and a frequency based on a frequency of the output clock, wherein the frequency to voltage converter comprises:
a first capacitor connected to a supply voltage,
a first resistor connected to the first capacitor at a first node and connected to a reference potential,
a first transistor connected to the supply voltage and the first node,
a second capacitor connected to the supply voltage,
a second resistor connected to the second capacitor at a second node and connected to a reference potential,
a second transistor connected to the supply voltage and the first node,
a first switch connecting the first node to the integrator, and
a second switch connecting the second node to the integrator; and
an integrator configured to generate the drive signal based on an integration of the feedback voltage and a reference voltage.

16. The oscillator of claim 15, comprising:
a frequency divider configured to receive the output clock and generate a feedback clock connected to a gate of the first transistor and an inverted feedback clock connected to a gate of the second transistor, wherein:
the feedback clock and the inverted feedback clock each has a frequency corresponding to a frequency of the output clock divided by an integer.

* * * * *